(12) United States Patent
Tsuruto et al.

(10) Patent No.: US 6,515,938 B2
(45) Date of Patent: Feb. 4, 2003

(54) SEMICONDUCTOR MEMORY DEVICE HAVING AN ECHO SIGNAL GENERATING CIRCUIT

(75) Inventors: Takahiro Tsuruto, Yokohama (JP); Takayuki Harima, Kawaguchi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/946,189

(22) Filed: Sep. 4, 2001

(65) Prior Publication Data

US 2002/0031043 A1 Mar. 14, 2002

(30) Foreign Application Priority Data

Sep. 8, 2000 (JP) ........................................ 2000-273596

(51) Int. Cl.$^7$ ................................................ G11C 8/00
(52) U.S. Cl. ........................................ 365/233; 365/194
(58) Field of Search .................................. 365/233, 194

(56) References Cited

U.S. PATENT DOCUMENTS

| | | | |
|---|---|---|---|
| 5,875,134 A | 2/1999 | Cloud | 365/193 |
| 5,920,511 A | 7/1999 | Lee et al. | 365/189.05 |
| 5,986,948 A | 11/1999 | Cloud | 365/193 |
| 6,134,180 A | * 10/2000 | Kim et al. | 365/233 |
| 6,162,832 A | * 12/2000 | Okajima | 711/169 |

* cited by examiner

*Primary Examiner*—M. Tran
(74) *Attorney, Agent, or Firm*—Hogan & Hartson, LLP

(57) ABSTRACT

A semiconductor memory device includes a memory cell array, an address register for taking in an address synchronizing with a clock, a decode circuit for selecting a memory cell of the memory cell array by decoding the address retained in the address register, a reading/writing circuit for reading data from the memory cell array and writing the data to the memory cell array, a data register for temporarily retaining the data read from and written to the memory cell array, synchronizing with the clock, and an echo signal generation circuit, synchronizing with the clock, for outputting an echo signal composed of a predetermined expected value pattern for notifying the outside of a data output with a delay time equal to a transmission delay time of the output data read from the memory cell array.

11 Claims, 8 Drawing Sheets

SEMICONDUCTOR MEMORY DEVICE HAVING AN ECHO SIGNAL GENERATING CIRCUIT

CROSS REFERENCE TO RELATED APPLICATION

This application is based upon and claims the benefit of priority from the prior Japanese Patent Application No. 2000-273596, filed on Sept. 8, 2000; the entire contents of which are incorporated herein by reference.

BACKGROUND OF THE INVENTION

The present invention relates generally to a clock synchronous semiconductor memory device, and more particularly to a semiconductor memory device constructed to generate an echo signal composed of a predetermined expected value pattern, synchronizing with a clock in order to notify of a data output an external device for controlling the semiconductor memory device.

There has hitherto been known a clock synchronous semiconductor memory device in which a data I/O register takes in external data at a timing synchronizing with a clock and outputs read data at a timing synchronizing with the clock, respectively.

A higher performance of this type of clock synchronous semiconductor memory involves more reliable transfer and receipt of the data between an external device and the semiconductor memory, and hence a system for generating an echo signal synchronizing with the clock in the semiconductor memory is used.

FIG. 7 is a block diagram showing one example of this type of system. A semiconductor memory 71 is classified as, e.g., a clock synchronous SRAM. An ASIC 72 supplies input data DIN and takes in output data DOUT together with a clock CK and an address ADD. The semiconductor memory 71 outputs an echo signal ECHO composed of a predetermined expected value pattern in synchronization with the clock CK. The ASIC 72 determines an output timing of the output data DOUT by use of this echo signal ECHO.

FIG. 8 shows an operation timing of the semiconductor memory 71 shown in FIG. 7. The address ADD is taken in synchronizing with the clock CK, and the output data DOUT is outputted likewise synchronizing with the clock CK. FIG. 8 shows a cycle time TKC defined as one cycle of the clock CK, ad a data output time TKQV defined as a delay time till the output data DOUT is actually outputted to an I/O terminal from an edge of the clock CK (a rising edge in the case of FIG. 8). The cycle time and the data output time are indexes for indicating a high speed performance of the semiconductor memory 71.

For notifying the ASIC 72 for controlling the semiconductor memory 71, of the data output time TKQV defined as a delay of the output data DOUT, the semiconductor memory 71 generates an echo signal ECHO with a delay δ corresponding to the data output time TKQV in synchronism with the clock CK. In FIG. 8, the echo signal ECHO is shown as a simple clock signal with the clock CK delayed by δ but is in fact preset as an expected value pattern composed of a predetermined combination of data of "1" and "0".

The high speed performance of the semiconductor memory is evaluated based on how much the cycle time TKC and the data output time TKQV are decreased. The cycle time TKC and the data output time TKQV are determined as specifications in consideration of a transmission characteristic of the memory internal circuit. If this type of semiconductor memory is operated fast at a cycle time equal to or smaller than, for instance, the cycle time prescribed in the specifications, the data output time TKQV relatively increases in terms of limitations of response performance of the internal circuit.

To be specific, the consideration is given to a case where the output data register of the synchronous SRAM is set as a master/slave type. In this case, the cycle time TKC or the data output time TKQV can be improved by adjusting activation timings of the master register and the slave register.

According to this adjusting method, however, there occurs a trade-off relationship in which one of the cycle time TKC and the data output time TKQV is improved, while the other declines.

On the other hand, the delay δ of the echo signal ECHO is fixed. Therefore, when operating the synchronous SRAM at the high speed, a phase difference between the data output and the echo signal occurs, and the echo generation might not sufficiently function.

This circumstance is explained referring to FIGS. 9 through 11. FIGS. 9–11 show a relationship between the cycle time TKC and the data output time TKQV in the synchronous SRAM, wherein a cycle time TKC0 and a data output time TKQV0 represent data unreadable limit points delimiting areas indicated by hatching. If used with the cycle time TKC reduced down close to the limit point TKC0, as described above, the data output time TKQV declines. As a result, the phase difference between the timing of the data output and the echo signal occurs in a range A where TKC and TKQV are small as shown in FIG. 9. This phase difference may be a cause of misreading etc.

It is required for preventing the occurrence of this phase difference between the echo signal ECHO and the data output that when actually used, as shown in, e.g., FIG. 10, the limit point TKC1 of the cycle time TKC is set to a value larger than the actual limit point TKC0, or alternatively, as shown in FIG. 11, the limit point TKQV1 of the data output time TKQV is set larger than the actual limit point TKQV0. The former setting, however, leads to a sacrifice of the cycle time, while the latter setting leads to a sacrifice of the data output time.

As explained above, if the conventional synchronous semiconductor memory having the echo signal function is operated fast, the phase difference between the output data and the echo signal occurs, and the problem is that the cycle time or the data output time must be sacrificed in order to prevent this phase difference.

SUMMARY OF THE INVENTION

An echo signal generation circuit according to the present invention comprises a memory cell array; an address register for taking in an address synchronizing with a clock; a decode circuit for selecting a memory cell of said memory cell array by decoding the address retained in said address register; a reading/writing circuit for reading data from said memory cell array and writing the data to said memory cell array; a data register for temporarily retaining the data read from and written to said memory cell array, synchronizing with the clock; and an echo signal generation circuit, synchronizing with the clock, for outputting an echo signal composed of a predetermined expected value pattern for notifying the outside of a data output with a delay time equal to a transmission delay time of the output data read from said memory cell array.

DETAILED DESCRIPTION OF THE INVENTION

Figure 1:
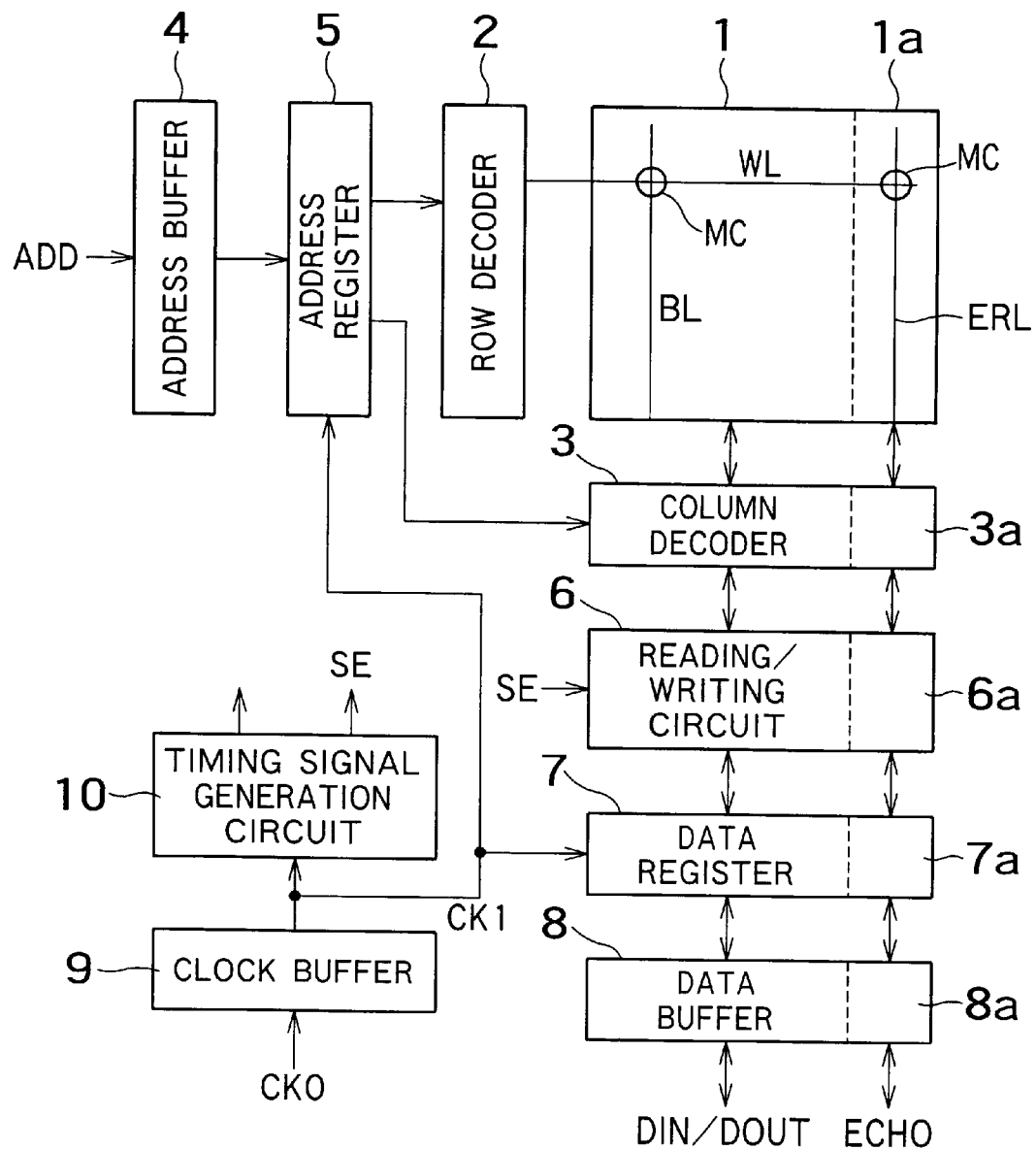
FIG. 1 is a diagram showing a configuration of a clock synchronous SRAM in a first embodiment of the present invention.

A few embodiments of the present invention will hereinafter be described with reference to the accompanying drawings. FIG. 1 shows a structure of a clock synchronous SRAM in a first embodiment of the present invention. A memory cell array (which will hereinafter be called a normal cell array) for executing normal data writing and reading processes, is configured by disposing a static memory cell MC at an intersection between a plurality of word lines WL and a plurality of bit lines BL. A row decoder 2 and a column decoder 3 select the word line WL and the bit line BL of the normal cell array 1 by decoding a row address and a column address.

Addresses ADD are taken into an address register 5 through an address buffer 4, and the row and column addresses are supplied to the row and column decoders 2, 3. A data reading/writing circuit 6 is illustrated as one circuit block, however, actually the reading circuit and the writing circuit are provided as separate systems. This reading/writing circuit 6 is connected via a data register 7 for temporarily retaining pieces of read data and write data and further via an I/O data buffer 8 to an I/O terminal.

An external clock CK0 is taken in by a clock buffer 9, thereby generating an internal clock CK1. This internal clock CK1 is supplied to an address register 5 and a data register 7, whereby the take-in of the address and the take-in of the I/O data are synchronously controlled. A timing generation circuit 10, based on the internal clock CK1, generates a timing signal such as an activation signal SE etc of the reading/writing circuit.

According to the first embodiment, an echo signal memory cell array 1a to which a predetermined expected value pattern is written, is provided as an echo signal generation circuit aside of the normal cell array 1. The word lines WL of the normal cell array 1 extend continuously as they are over this echo signal memory array 1a, and a memory cell MC is disposed at an intersection between this word line WL and an echo signal bit line EBL. A width (i.e., the number of word lines), in the direction of the bit line BL, of the echo signal memory cell array 1a is the same as that of the normal cell array 1. Referring to FIG. 1, for an illustrative convenience, the word lines WL and the echo signal bit lines EBL are each shown as one single line, however, as a matter of fact, a plurality of memory cells are disposed per word line WL in the echo signal memory cell array 1a so that the memory cells are accessed simultaneously with the normal cell array 1 via the one single word line WL and an expected value pattern of plural bits is outputted. Accordingly, a plurality of echo signal bit lines EBL are prepared in the echo signal memory cell array 1a.

An echo signal data transmission route having the same structure as that of a data transmission route of the normal cell array 1, is provided in order to execute the data reading/wiring processes of the echo signal memory cell array 1a under the same data transmission condition as that of the normal cell array 1. Namely, a dummy column decoder 3a for fetching the echo signal is provided aside of the column decoder 3. An echo signal reading/writing circuit 6a is provided aside of the reading/writing circuit 6. An echo signal data register 7a is provided aside of the data register 7. An echo signal data buffer 8a is provided aside of the data buffer 8.

More specifically, the dummy column decoder 3a is constructed of the same selection gate transistor (which is, however always kept ON) as that of the column decoder 3f.

Alternatively, in the case of adjusting ON timing of a select gate transistor in the dummy column decoder, it is possible to encode normal column decode signal and supply the encoded signal to a gate signal of the select gate transistor of the dummy column decoder.

Furthermore, the echo signal reading/writing circuit 6a has the same configuration as the reading/writing circuit 6 on the side of the normal cell array. The echo signal data register 7a has the same configuration as the data register 7 on the side of the normal cell array.

The echo signal data register 7a is, as in the case of the data register 7 for normally dealing with the data, synchronously controlled by the internal clock CK1. The echo signal reading/writing circuit 6a is, as in the case of the reading/writing circuit 6 for normally dealing with the data, activated by the activation signal SE.

With this construction, it follows that the echo signal read from the echo signal cell array 1a synchronously with the normal cell array 1 is outputted outside with the same transmission delay time as that of the output data.

Figure 2:
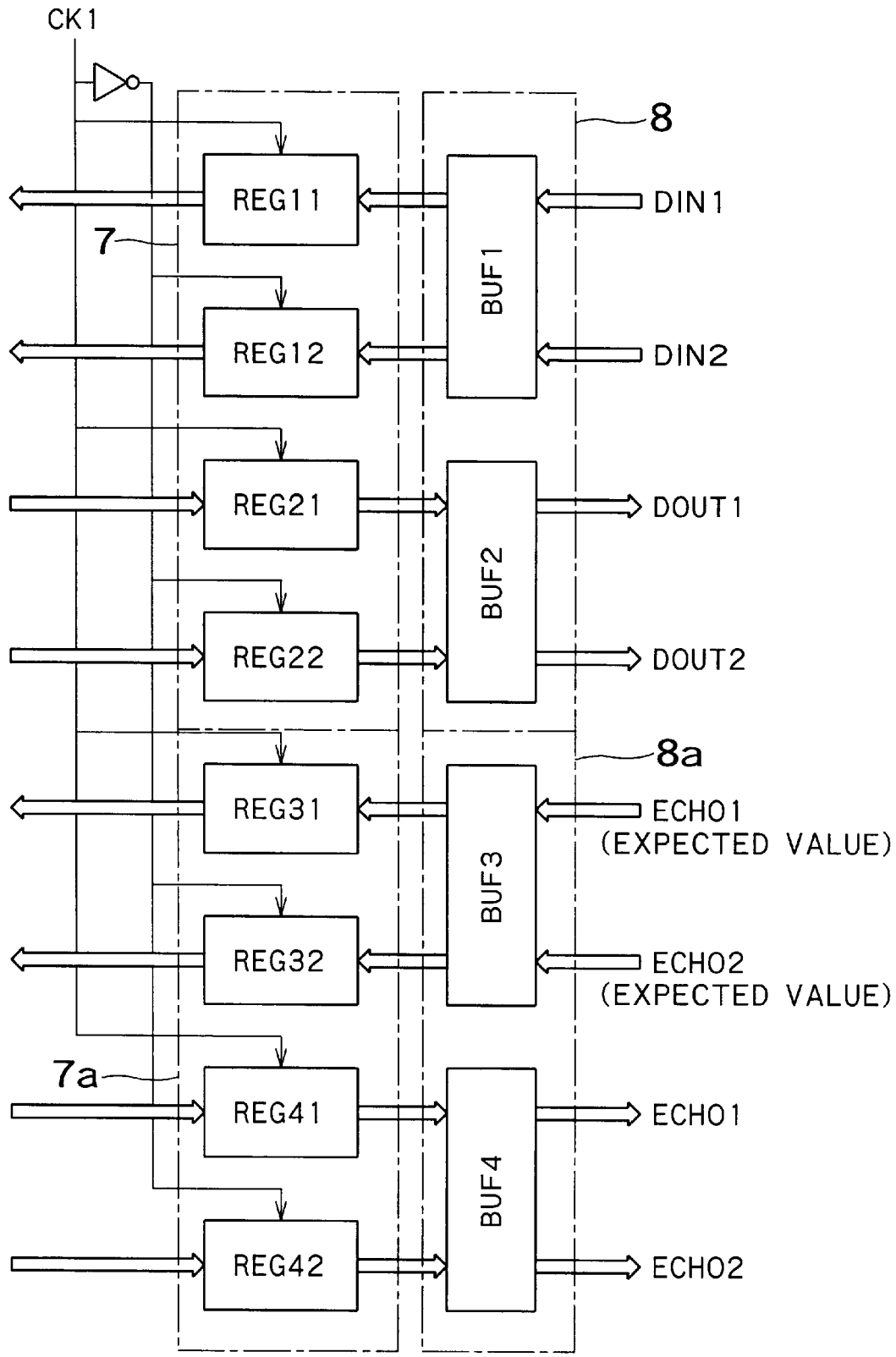
FIG. 2 is a diagram showing a configuration of a data register in the first embodiment thereof.

The synchronous SRAM in the first embodiment is preferably of a DDR (Dual Data Rate) system in which the data are inputted and outputted synchronizing with both of a rising edge and a falling edge of the clock. In this case, structures of the data registers 7, 7a and the data buffers 8, 8a become as shown in FIG. 2. To be specific, the data register 7 is provided with 2-system input register groups REG11, REG12 of which the take-in timings are a rising edge and a falling edge of the clock CK1, corresponding to 2-system input data DIN1, DIN2 of which the take-in timings are the rising edge and the falling edge of the clock CK1.

Similarly, the data register 7 is provided with 2-system output register groups REG21, REG22 of which the take-in timings are the rising edge and the falling edge of the clock CK1, corresponding to 2-system output data DOUT1, DOUT2 of which the take-in timings are the rising edge and the falling edge of the clock CK1.

The echo signal data register 7a has the same configuration. Namely, the echo signal data register 7a is provided with 2-system input register groups REG31, REG32 of which the take-in timings are the rising edge and the falling edge of the clock CK1, corresponding to 2-system echo input signals (expected values) ECHO1, ECHO2 of which the take-in timings are the rising edge and the falling edge of the clock CK1. Similarly, the echo signal data register 7a is provided with 2-system output register groups REG41, REG42 of which the take-in timings are the rising edge and the falling edge of the clock CK1, corresponding to 2-system echo output signals ECHO1, ECHO2 of which the take-in timings are the rising edge and the falling edge of the clock CK1.

Figure 3:
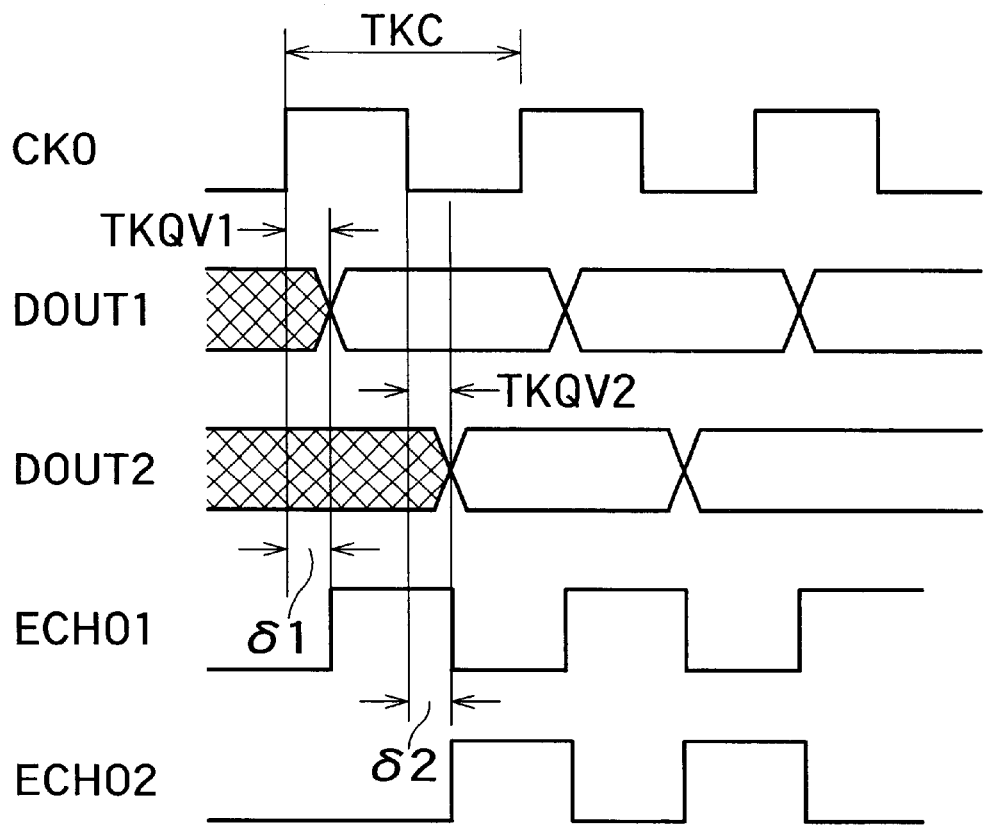
FIG. 3 is a timing chart of a data reading operation in the embodiment.

FIG. 3 shows the timings of the data output DOUT1, DOUT2 ad the echo signal outputs ECHO1, ECHO2 in the synchronous SRAM in the first embodiment. The data outputs DOUT1, DOUT2 are outputted with delays of data output times TKQV1, TKQV2 from the rising edge and the falling edge thereof, synchronizing with the clock CKO. By contrast, the echo signal route is structured to have the same delay characteristic as that of the data transmission route, and hence the echo signal outputs ECHO1, ECH02 are outputted with the same time delays δ1, δ2 as those of the data output times TKQV1, TKQV2 of the data outputs DOUT1, DOUT2.

Figure 4:
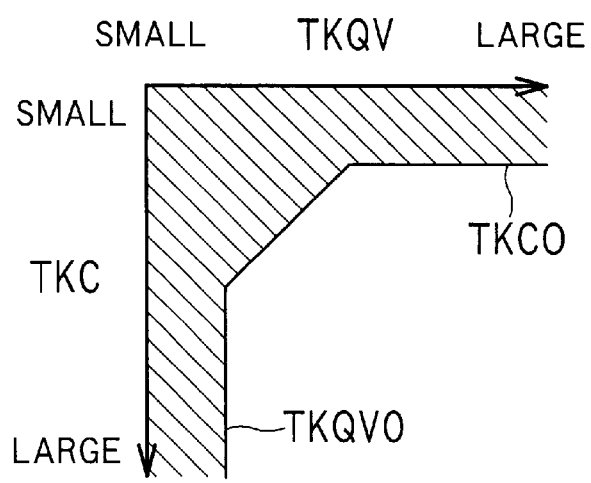
FIG. 4 is a diagram showing a relationship between a cycle time and a data output time in the first embodiment.
Figure 9:
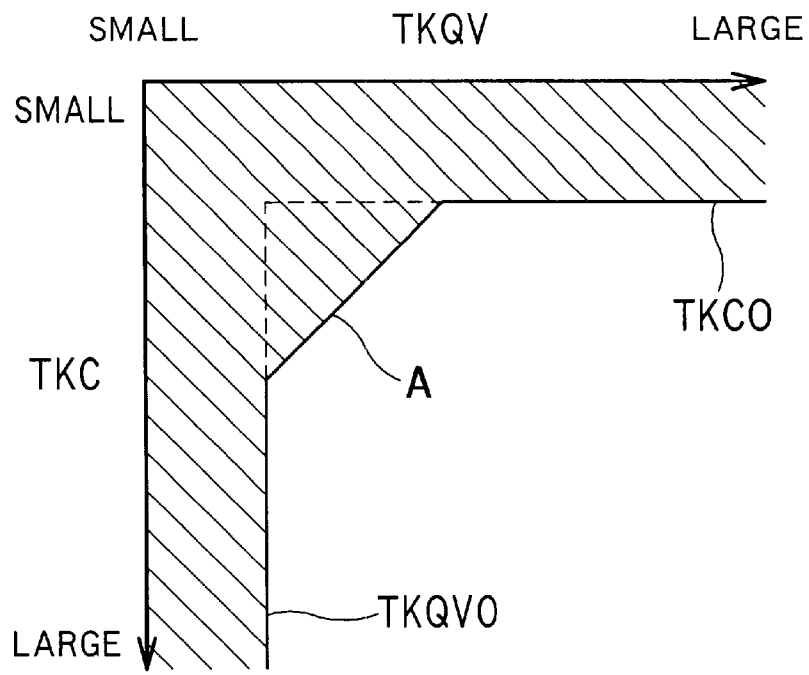
FIG. 9 is a diagram showing a relationship between the cycle time and the data output time of the clock synchronous SRAM.
Figure 10:
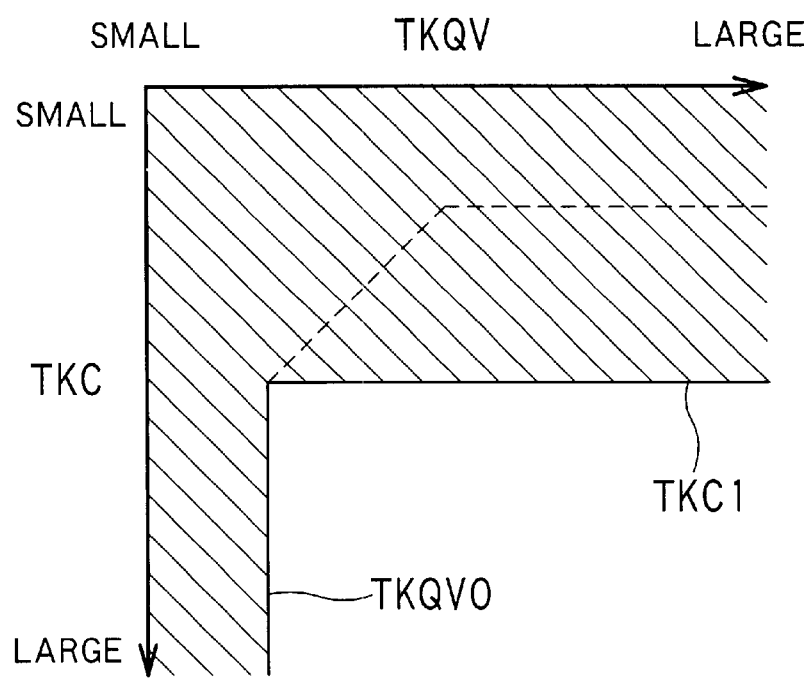
FIG. 10 is a diagram showing a relationship between the cycle time and the data output time of the clock synchronous SRAM in a way that sacrifices the cycle time.
Figure 11:
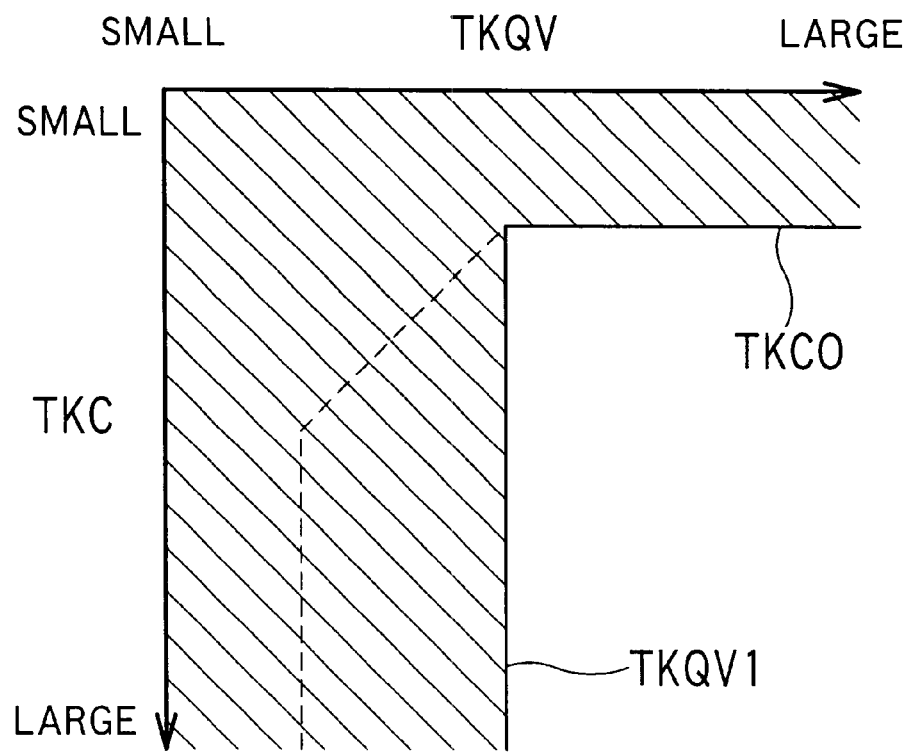
FIG. 11 is a diagram showing a relationship between the cycle time and the data output time of the clock synchronous SRAM in a way that sacrifices the data output time.

Hence, according to the first embodiment, when the SRAM is operated at a high speed with a cycle time TKC decreased, even if the data output times TKQV1, TKQV2 might decline, the delay times of the echo signals ECHO1, ECHO2 change following up these declines. As a result, there is no phase difference between the data output and the echo signal even when operated at the high speed. Namely, in the case of the first embodiment, a relationship between the cycle time TKC and the data output time TKQV comes to be as shown in FIG. 4. As obvious from a comparison with FIG. 9, a phase difference occurrence area A between the data output and the echo signal disappears. This enables the high-speed operation of the synchronous SRAM to be actualized without sacrificing the cycle time TKC or the data output time TKQV for preventing the phase difference as shown in FIG. 10 or 11.

Further, in the case of the first embodiment, a write route having the same configuration as that of the write route for the normal cell array 1, is prepared for the echo signal memory cell array 1a as well as preparing the read-out route. Accordingly, there does occur the phase difference between the data output and the echo signal normally due to a deviation between the data write timing and the echo signal write timing.

FIG. 1 shows an example where the echo signal memory cell array 1a is disposed at a side end of the normal cell array 1, to be specific, at a side end, opposite to the row decoder 2, of the word line. This echo signal memory cell array 1a may also be disposed at the side end thereof on the side of the row decoder 2 or at the central portion of the normal cell array 1.

Further, the echo signal memory cell array 1a is preferably formed in the same device forming well as that of the normal cell array 1 and may also be formed in other well, or may take such a configuration as to provide the row decoder separately from the normal cell array 1.

Figure 5:
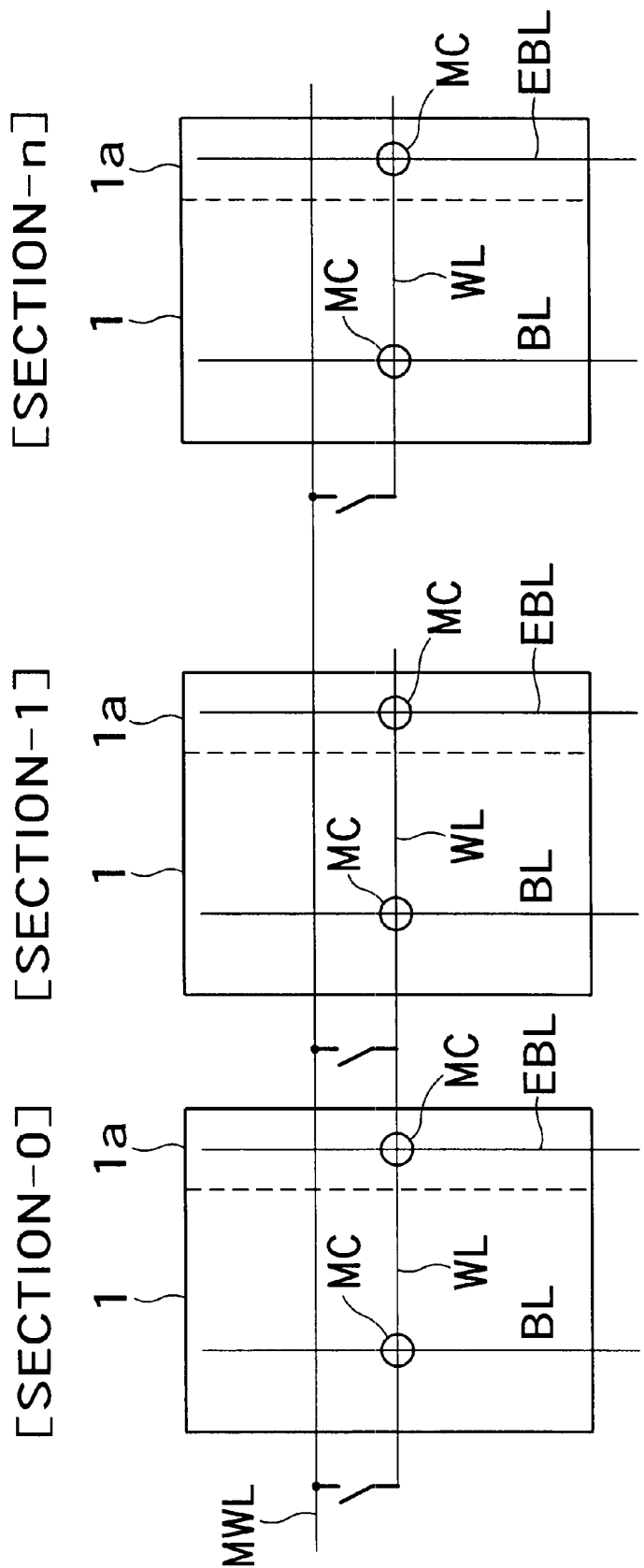
FIG. 5 is a diagram showing another example of the configuration of the memory cell array in a second embodiment.

In the case of a large capacity memory, the memory cell array is sectioned into a plurality of array sections. FIG. 5 shows a configuration of the memory cell array sectioned in the word-line direction into n-pieces of array sections. The word lines WL and the bit lines BL are continuously laid out per array section. The word line in each array section is connected by a selection switch to, e.g., a main word line MWL extending over all the array section.

In the case of the cell array configuration described above, as shown in FIG. 5, it is preferable that the echo signal memory cell arrays 1a be disposed adjacent to the normal cell array 1 in a way that disperses the arrays 1a to the respective array sections. Thus, if the echo signal memory cell array 1a is disposed for every array section, an influence of a scatter in the cell characteristic in each array section can be reduced also in the case of the large capacity memory. Namely, it is feasible to restrain the deviation between the output timing of the normal data and the echo signal output timing with a high precision.

Figure 6:
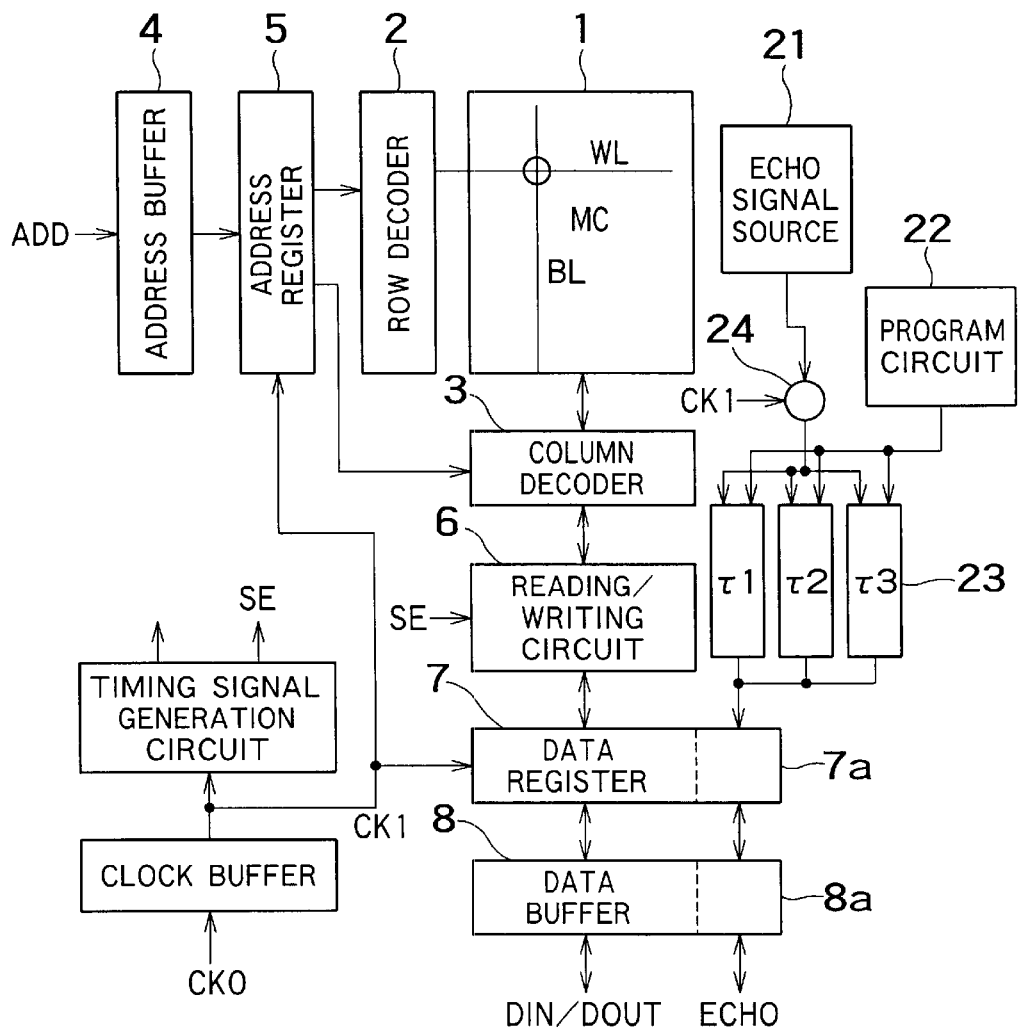
FIG. 6 is a diagram showing a configuration of the clock synchronous SRAM in the second embodiment.
Figure 7:
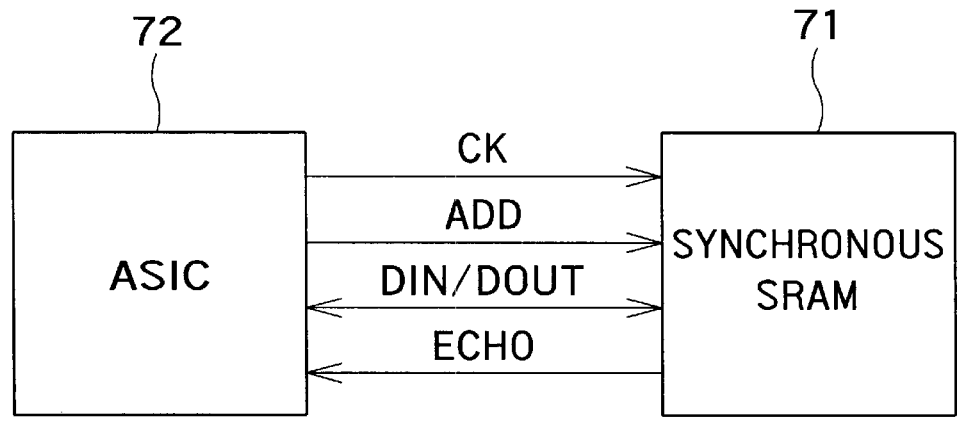
FIG. 7 is a diagram showing a control system of the clock synchronous SRAM based on ASIC.
Figure 8:
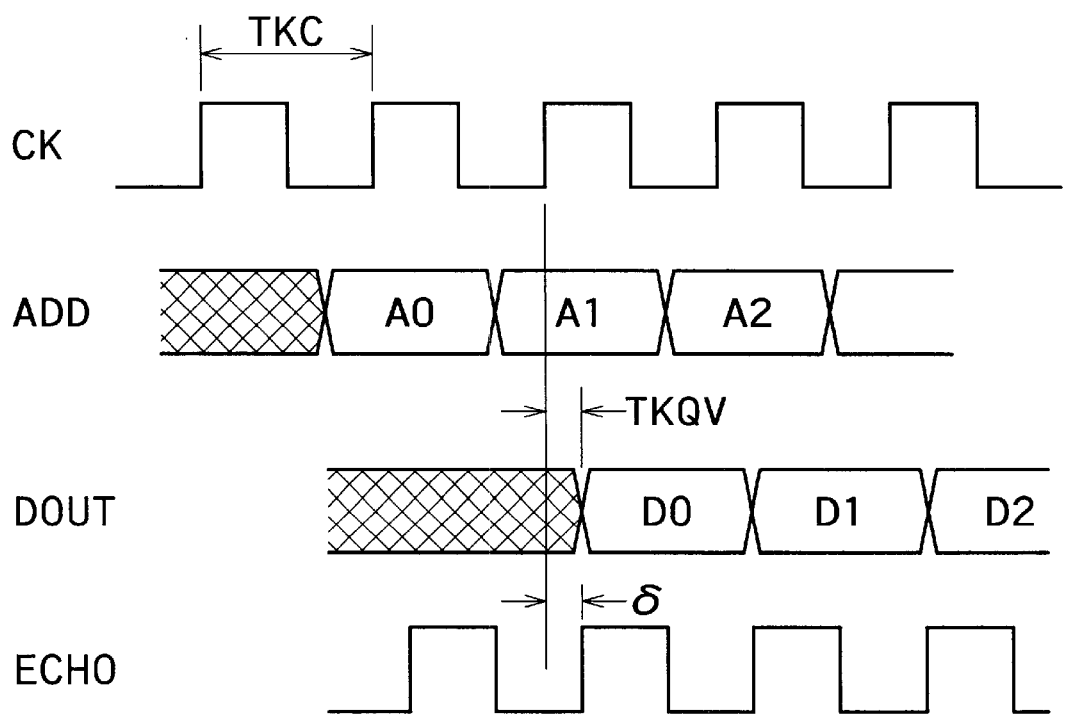
FIG. 8 is a diagram showing an operation timing of the clock synchronous SRAM.

FIG. 6 shows a configuration of a clock synchronous SRAM according to a second embodiment of the present invention. The components, corresponding to those in FIG. 1, of this clock synchronous SRAM are marked with the same symbols, and the repetitive explanations in details are omitted. In the first embodiment illustrated in FIG. 1, the echo signal generation circuit take the same configuration of the read/writing route of the normal cell array 1. By contrast, according to the second embodiment, the echo signal reading route takes a configuration different from the data reading route of the normal cell array 1 but is structured to obtain equivalently the same delay characteristic.

Namely, an echo signal source 21 for generating the echo signal exhibiting a predetermined expected value pattern is provided in the second embodiment. A plurality of delay circuits 23 in which different delay times $\tau 1, \tau 2, \ldots$ are set, are provided between the echo signal source 21 and the echo signal data register 7a. Any one of these delay circuits 23 is selected by programming a program circuit 22 with a control signal given from an external terminal.

The echo signal is read from the echo signal source 21 by use of a transfer switch 24 controlled by the internal clock CK1. Further, its the same as the first embodiment that the echo signal data register 7a is controlled by the clock CK1.

In the second embodiment, if a cycle time TKC for reading the data is switched over to, e.g., a low speed mode, an intermediate speed mode and a high speed mode, one of the delay circuits 23 is selected corresponding to the switched operation mode. With this contrivance, as in the first embodiment, it is possible to prevent the occurrence of the phase difference between the data output and the echo signal during the high speed operation.

Note that the echo signal source 21 may be constructed of the echo signal memory cell array as in the first embodiment.

The program circuit 22 is not arbitrarily variable from outside and may be structured so that the data is fixedly programmed by use of a fuse circuit etc. In this case, the program circuit 22 is programmed so that the optimum delay circuit 23 is selected corresponding to a result of a test at a wafer-stage with the manufacturing process finished, i.e., corresponding to a transmission characteristic of each memory chip.

With this architecture, though incapable of selecting an arbitrary echo signal delay at the stage of using the memory, the echo signal under the optimum condition taking the scatter of the memory chip into consideration, can be outputted.

The discussions on the first and second embodiments have been focused on the SRAM, however, the present invention is not limited to this SRAM and can be similarly applied to other semiconductor memories such as a clock synchronous DRAM, EEPROM and so on.

As discussed above, according to the present invention, the echo signal generation circuit is so constructed as to eliminate the phase difference between the data read timing and the echo signal during the high speed operation in the clock synchronous semiconductor memory, whereby the high speed operation can be attained without sacrificing the cycle time and the data output time as well.

What is claimed is:

1. A semiconductor memory device comprising:
   a memory cell array;
   an address register for taking in an address signal synchronizing with a clock;
   a decode circuit for selecting a memory cell of said memory cell array by decoding the address signal retained in said address register;
   a reading/writing circuit for reading data from said memory cell array and writing the data to said memory cell array;
   a data register for temporarily retaining the data read from and written to said memory cell array, synchronizing with the clock; and
   an echo signal generation circuit, synchronizing with the clock, which outputs an echo signal composed of a predetermined expected value pattern to notify the outside of a data output with a delay time equal to a transmission delay time of the output data read from said memory cell array.

2. A semiconductor memory device comprising:
   a memory cell array;
   an address register for taking in an address signal synchronizing with a clock;
   a decode circuit for selecting a memory cell of said memory cell array by decoding the address signal retained in said address register;
   a reading/writing circuit for reading data from said memory cell array and writing the data to said memory cell array;
   a data register for temporarily retaining the data read from and written to said memory cell array, synchronizing with the clock; and
   an echo signal generation circuit, synchronizing with the clock, which outputs an echo signal composed of a predetermined expected value pattern to notify the outside of a data output with a delay time equal to a transmission delay time of the output data read from said memory cell array, wherein said echo signal generation circuit includes:
      an echo signal memory cell array to which the expected value pattern is written and from which the echo signal is ready by its being accessed simultaneously with said memory cell array,
      an echo signal reading circuit to read data of said echo signal memory cell array; and
      an echo signal data register for temporarily retaining the data read from said echo signal memory cell array, synchronizing with the clock.

3. The semiconductor memory device according to claim 2, wherein said echo signal generation circuit further comprises a writing circuit to write the data to said echo signal memory cell array.

4. The semiconductor memory device according to claim 2, wherein said memory cell array has word lines and bit lines intersecting each other by a plurality of lines, and memory cells each disposed at an intersection between the word lines and the bit lines, and
   said echo signal memory cell array has the plurality of word lines shared with said memory cell array and a plurality of echo signal bit lines intersecting these word lines, and memory cells each disposed at an intersection between the word lines and the echo signal bit lines.

5. The semiconductor memory device according to claim 2, wherein said memory cell array is sectioned into a plurality of array sections, and
   said echo signal memory cell array is provided for each of said array sections.

6. The semiconductor memory device according to claim 2, wherein said echo signal generation circuit includes:
   an echo signal source which outputs the echo signal composed of the predetermined expected value pattern;
   a plurality of delay circuits prepared to give a predetermined transmission delay time to the echo signal outputted from said echo signal source and having delay times different from each other; and
   a program circuit for selecting one of said delay circuits and setting the transmission delay time of the echo signal.

7. The semiconductor memory device according to claim 1, wherein said memory cell array is structured in a dual data rate system to input and output the data, synchronizing with both of rising and falling edges of the clock.

8. A semiconductor memory device comprising:
   a memory cell array;
   an address register for taking in an address signal synchronizing with a clock;
   a decode circuit for selecting a memory cell of said memory cell array by decoding the address signal retained in said address register;
   reading/writing circuit for reading data from said memory cell array and writing the data to said memory cell array;
   a data register for temporarily retaining the data read from and written to said memory cell array, synchronizing with the clock; and
   an echo signal generation circuit, synchronizing with the clock which outputs an echo signal composed of a predetermined expected value pattern to notify the outside of a data output with a delay time;
   wherein said memory cell array is structured in a dual data rate system to input and output the data, synchronizing with both of rising and falling edges of the clock; and
   wherein said data register temporarily retains a 2-system input and output data corresponding to the rise and the fall of the clock.

9. The semiconductor memory device according to claim 8, wherein said echo signal generation circuit which outputs 2-system echo signals composed of predetermined expected value patterns for notifying the outside of data outputs with a first and second delay time s equal to first and second transmission delay times of the 2-system output data.

10. A semiconductor memory device according to claim 8, wherein said data register includes:
    2-system input register groups of which take-in timings are the rising edge and the falling edge of the clock with respect to the 2-system input data of which take-in timings are the rising edge and the falling edge of the clock; and 2-system output register groups of which take-in timings are the rising edge and the falling edge of the clock with respect to the 2-system output data of which the take-in timings are the rising edge and the falling edge of the clock.

11. A semiconductor memory device according to claim 10, wherein said echo signal generation circuit includes:

2-system input register groups for taking in expected values of the 2-system echo input signals of which the take-in timings are the rising edge and the falling edge of the clock; and 2-system output register groups for retaining 2-system echo output signals of which the take-in timings are the rising edge and the falling edge of the clock.

* * * * *